(12) United States Patent
Speier et al.

(10) Patent No.: US 6,624,629 B1
(45) Date of Patent: Sep. 23, 2003

(54) OPTIMIZING CHARACTERISTICS OF RF PULSES USED IN NMR MEASUREMENTS

(75) Inventors: Peter Speier, Stafford, TX (US); Bruno Luong, Stafford, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 09/566,365

(22) Filed: May 8, 2000

(51) Int. Cl.[7] .......................... G01V 3/00; G01R 33/20
(52) U.S. Cl. ...................................................... 324/303
(58) Field of Search ................................ 324/303, 307, 324/314

(56) References Cited

U.S. PATENT DOCUMENTS

| | | | | |
|---|---|---|---|---|
| 5,309,098 A | * | 5/1994 | Coates et al. ............... | 324/303 |
| 5,471,141 A | * | 11/1995 | Yoshida et al. ............ | 324/314 |
| 5,517,115 A | * | 5/1996 | Prammer ..................... | 324/303 |
| 6,005,389 A | * | 12/1999 | Prammer ..................... | 324/303 |
| 6,094,049 A | * | 7/2000 | Rosenfeld et al. .......... | 324/307 |
| 6,163,153 A | * | 12/2000 | Reiderman et al. ......... | 324/314 |
| 6,429,654 B1 | * | 8/2002 | Itskovich et al. ........... | 324/314 |
| 6,466,013 B1 | * | 10/2002 | Hawkes et al. ............. | 324/303 |

* cited by examiner

Primary Examiner—Edward Lefkowitz
Assistant Examiner—Tiffany A. Fetzner
(74) Attorney, Agent, or Firm—Kevin P. McEnaney; Brigitte L. Jeffery; John Ryberg

(57) ABSTRACT

An NMR measurement apparatus includes at least one magnet, at least one antenna, an RF pulse transmitter and a controller. The magnets) establish a static magnetic field, and the RF pulse transmitter is coupled to the antenna(e). The controller is coupled to the transmitter and the antenna (e). The controller is adapted to cause the RF transmitter to transmit RF pulse sequences into a sample and for each different RF pulse sequence, vary an estimated pulse width for producing a predetermined flip angle by a different scaling factor to produce flip angles near the predetermined flip angle. The controller is adapted to receive spin echo signals in response to the transmission of the RF pulse sequences; determine a property of the sample in response to the spin echo signals; and use the spin echo signals to determine an optimal pulse width for producing the predetermined flip angle.

55 Claims, 6 Drawing Sheets

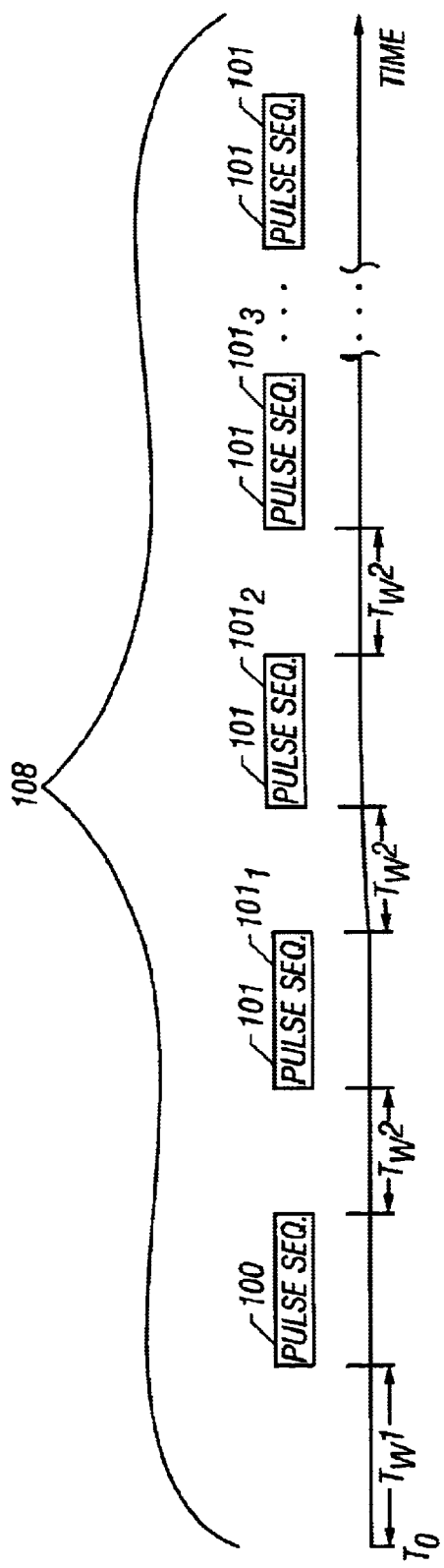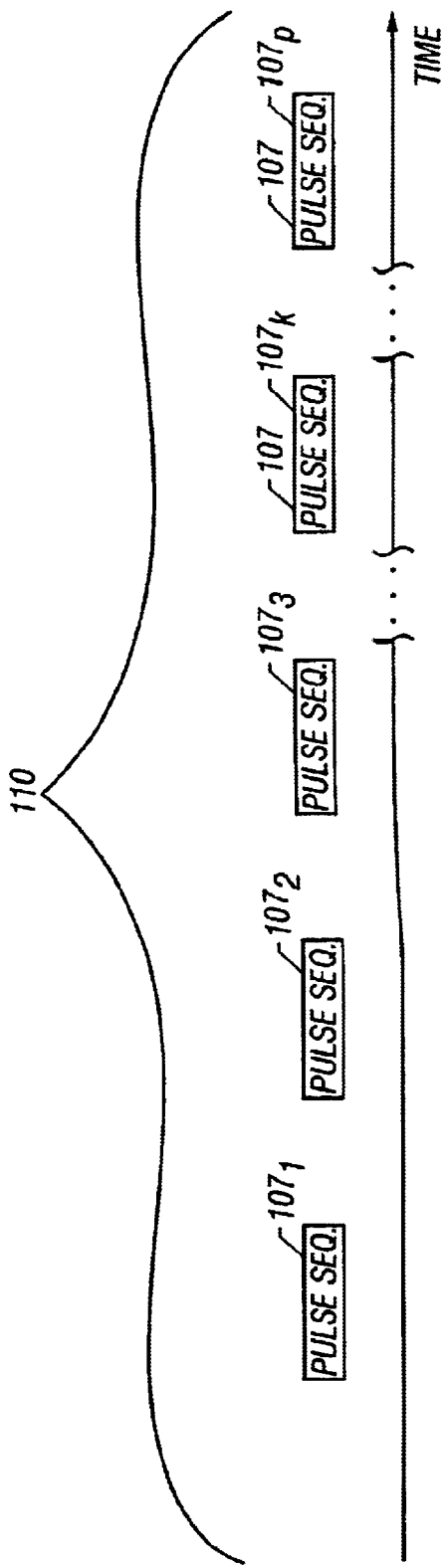

US 6,624,629 B1

OPTIMIZING CHARACTERISTICS OF RF PULSES USED IN NMR MEASUREMENTS

BACKGROUND OF THE INVENTION

This invention generally relates to optimizing characteristics (pulse widths and/or pulse amplitudes, as examples),of radio frequency (RF) pulses that are used in connection with nuclear magnetic resonance (NMR) measurements, and more particularly, the invention relates to a technique and tool to continuously monitor and adapt the characteristics of the RF pulses to maximize the strength of detected spin echo signals.

Nuclear magnetic resonance (NMR) measurements typically are performed to investigate. properties of a sample. For example, an NMR wireline or logging while drilling (LWD) It downhole tool may,be used to measure properties of subterranean formations. In this manner, a typical NMR tool may, for example, provide a lithology-independent measurement of the porosity of a particular formation by determining the total amount of hydrogen present in fluids of the formation. Equally important, the NMR tool may also provide measurements that indicate the dynamic properties and environment of the fluids, as these factors may be related to petrophysically important parameters. For example, the NMR measurements may provide permeability and viscosity information that is difficult or impossible to derive from other conventional logging arrangements. Thus, it is the capacity of the NMR tool to perform these measurements that makes it particularly attractive versus other types of downhole tools.

Typical NMR logging tools include a magnet that is used to polarize hydrogen nuclei (protons) in the formation and a transmitter coil, or antenna, that emits radio frequency (RF) pulses. A receiver antenna may measure the response (indicated by received spin echo signals) of the polarized hydrogen to the transmitted pulses. Quite often, the transmitter and receiver antennae are combined into a single transmitter/receiver antenna.

There are several experimental parameters that may be adjusted according to the. objectives of the NMR measurement and expected properties of the formation fluids. However, the NMR techniques employed in current NMR tools typically involve some variant of a basic two step sequence that includes a polarization period followed by an acquisition sequence.

During the polarization period (often referred to as a "wait time") the protons in the formation polarize in the direction of a static magnetic field (called $B_0$) that is established by a permanent magnet (of the NMR tool). The growth of nuclear magnetization $M(t)$ (i.e., the growth of the polarization) is characterized by the "longitudinal relaxation time" (called T1) of the fluid and its maximum value (called $M_0$), as described by the following equation:

$$M(t) = M_0\left(1 - e^{\frac{t}{T_1}}\right) \qquad \text{Equation 1}$$

The duration of the polarization period may be specified by the operator (conducting the measurement) and includes the time between the end of one acquisition sequence and the beginning of the next. For a moving tool, the effective polarization period also depends on tool dimensions and logging speed.

Referring to FIG. 1, as an example, a sample (in the volume under investigation) may initially have a longitudinal magnetization $M_z$ 10 of approximately zero. The zero magnetization may be attributable to a preceding acquisition sequence, for example. However, the magnetization $M_z$ 10 (under the influence of the $B_0$ field) increases to a magnetization level (called $M(t_w(1))$) after a polarization time $t_w(1)$ after zero magnetization. As shown, after a longer polarization time $t_w(2)$ from zero magnetization, the $M_z$ magnetization 10 increases to an $M(t_w(2))$ level.

An acquisition sequence begins after the polarization period. For example, an acquisition sequence may begin at time $t_w(1)$, a time at which the magnetization Mz 10 is at the $M(t_w(1))$ level. At this time, RF pulses are transmitted from a transmitter antenna of the tool. The pulses, in turn, produce spin echo signals 16, and the initial amplitudes of the spin echo signals 16 indicate a point on the magnetization $M_z$ 10 curve, such as the $M(t_w(1))$ level, for example. Therefore, by conducting several measurements that have different polarization times, points on the magnetization $M_z$ 10 curve may be derived, and thus, the T1 time for the particular formation may be determined. A receiver antenna (that may be formed from the same coil as the transmitter antenna) receives the spin echo signals 16 and stores digital signals that indicate the spin echo signals 16.

As an example, for the acquisition sequence, a typical logging tool may emit a pulse sequence based on the CPMG (Carr-Purcell-Meiboom-Gill) pulse sequence. The application of the CPMG pulse train includes first emitting an RF burst, called an RF pulse, that has the appropriate duration to rotate the magnetization, initially polarized along the $B_0$ field, by 90° into a plane perpendicular to the $B_0$ field. The RF pulse that rotates the magnetization by 90° is said to introduce a flip angle of 90°. Next, a train of equally spaced 180° RF pulses is transmitted. Each 180° RF pulse has the appropriate duration to rotate the magnet moment by 180° to refocus the spins to generate each spin echo signal 16. Each RF pulse that rotates the magnetization by 180° is said to introduce a flip angle of 180°. Individual hydrogen nuclei experience slightly different magnetic environments during the pulse sequence, a condition that results in an irreversible loss of magnetization and a consequent decrease in successive echo amplitudes. The rate of loss of magnetization is characterized by a "transverse relaxation time" (called T2) and is depicted by the decaying envelope 12 of FIG. 1.

In general, the above NMR measurement of the T1 time may be referred to as a saturation recovery, or T1-based, measurement due to the fact that the nuclear spins are saturated (i.e., the magnetization is decreased to approximately zero) at the beginning of the wait time. Thus, from the NMR measurement, a value of the magnetization $M_z$ 10 curve may be determined from the initial signal amplitude. In general, an NMR measurement of the signal decay may be labeled a T2-based measurement. It is noted that every T2 measurement is T1 weighted due to the fact that prepolarization occurs during the wait time before the acquisition sequence. The T2 time may be estimated from the observed decay of the envelope 12.

Optimal NMR signal detection needs precise flip angles (90° for the excitation pulse and 180° for the refocusing pulses). The flip angle a may be varied by either adjusting the amplitude of the RF pulse (to change $B_1$) and/or its duration $t_p$, as described by the following equation:

$$\alpha = \gamma \cdot B_1 \cdot t_p, \qquad \text{Equation 2}$$

where "$\gamma$" represents the gyromagnetic ratio, a nuclear constant.

For $\alpha_{refoc}$ (the flip angle of the 180° pulse) $=2\alpha_{exc}$ (the flip angle of the 90° pulse), simulations show that a spin echo signal (called $\phi$)) depends on a as follows:

$$\sin\alpha_{exc} > \frac{\phi(\alpha_{exc})}{\phi_{max}} > \sin^2\alpha_{exc'} \qquad \text{Equation 3}$$

with $\phi_{max}$ defined as $$\phi\left(\frac{\pi}{2}\right),$$

the maximum possible value of the $\phi$ signal.

Given the field geometry of the NMR tool and the amplitude of the RF pulses, the $B_1$, field in the resonance volume may be estimated, so that the duration $t_p$ may be selected to produce the desired flip angle. Unfortunately, the $B_1$, field in the resonance volume may be different than expected, a difference that causes the flip angle to be incorrect, thereby affecting the accuracy of the NMR measurement. The variation in the $B_1$ field may be due to, as examples, a decrease in the power supply voltage (of the tool) that causes the pulse amplitude of the RF pulse to be different than expected; the presence of magnetic drilling debris; a temperature change; and/or imperfections in the field geometry of the NMR tool.

For purposes of accounting for these non-ideal variations in the $B_1$ field, a pickup coil may be used to sense the actual value of $B_1$, at the position of the pickup coil. To determine the value of the $B_1$ in the resonance volume, predetermined lookup tables may then be used. A drawback of this technique is that unforeseen variations in the radial dependence of $B_1$ and $B_0$ (due to conductivity changes or magnetic debris accumulation, as examples) are not accounted for.

Thus, there is a continuing need for an arrangement and/or technique to address one or more of the problems that are stated above.

SUMMARY OF THE INVENTION

In an embodiment of the invention, a method includes estimating a pulse characteristic needed to produce a predetermined flip angle; and transmitting different RF pulse sequences into a sample. For each different RF pulse sequence, the estimated characteristic is varied by a different scaling factor to produce flip angles near the predetermined flip angle. Spin echo signals are received in response to the transmission of the RF pulse sequences; and a property of the sample is determined in response to the spin echo signals. The spin echo signals are used to determine an optimal value for the common pulse characteristic.

In some embodiments of the invention, the spin echo signals may be stacked in a manner that ensures an increasing signal-to-noise ratio. In this manner, this technique may include discarding spin echo signals that have small amplitudes, and this technique may include weighting the stacking based on associated signal-to-noise ratios.

In another embodiment of the invention, an NMR measurement apparatus includes at least one magnet, at least one antenna, an RF pulse transmitter and a controller. The magnet(s) establish a static magnetic field, and the RF pulse transmitter is coupled to the antenna(e). The controller is coupled to the transmitter and the antenna(e). The controller is adapted to cause the RF transmitter to transmit RF pulse sequences into a sample and for each different RF pulse sequence, vary an estimated pulse width for producing a predetermined flip angle by a different scaling factor to produce flip angles near the predetermined flip angle. The controller is adapted to receive spin echo signals in response to the transmission of the RF pulse sequences; determine a property of the sample in response to the spin echo signals; and use the spin echo signals to determine an optimal pulse width for producing the predetermined flip angle.

Advantages and other features of the invention will become apparent from the following description, drawing and claims.

BRIEF DESCRIPTION OF THE DRAWING

FIG. 4 is a schematic diagram of an NMR measurement scan according to an embodiment of the invention.

FIG. 5 is a schematic diagram depicting a pattern of RF pulse sequences that may be used in a particular NMR measurement scan according to an embodiment of the invention.

DETAILED DESCRIPTION

Figure 1:
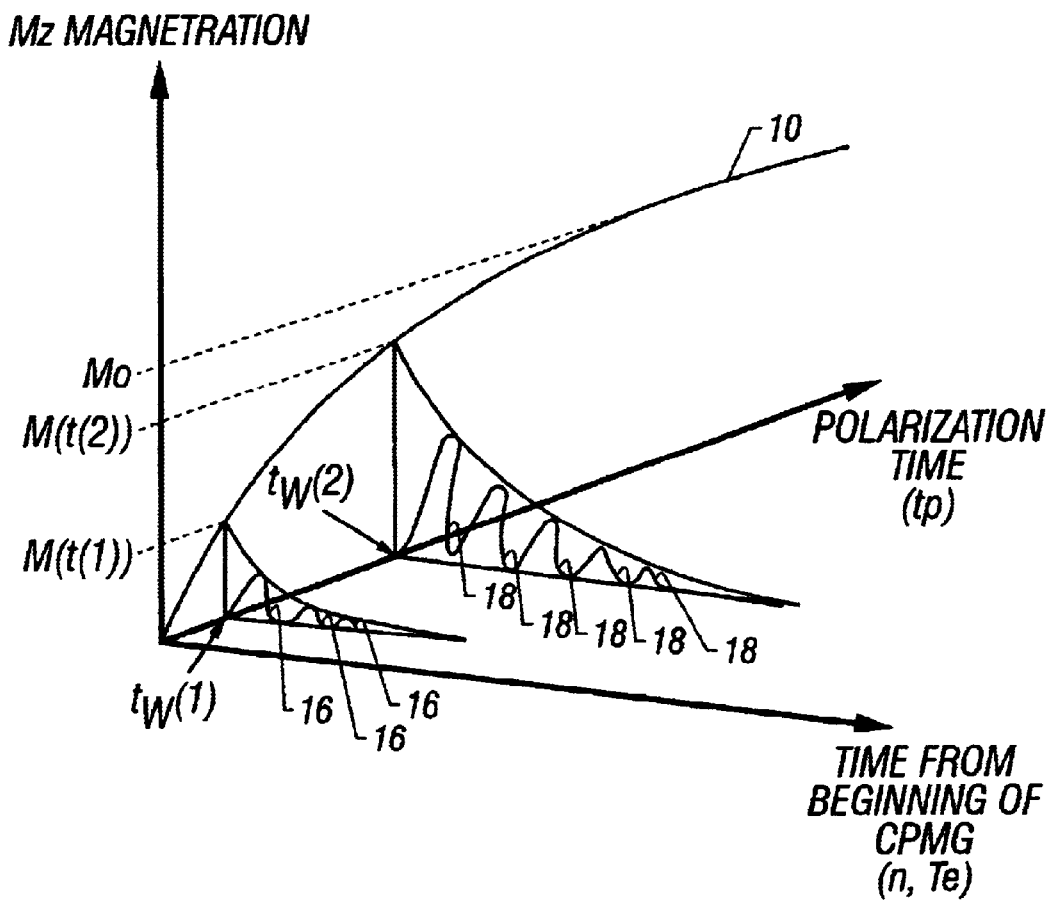
FIG. 1 is a graph of longitudinal magnetization illustrating T1 and T2 measurements of the prior art.
Figure 2:
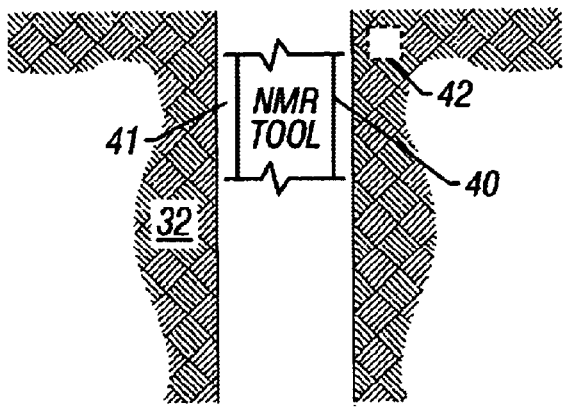
FIG. 2 is a schematic diagram of a well.

Referring to FIG. 2, an embodiment 40 of a downhole nuclear magnetic resonance (NMR) tool in accordance with the invention is designed to determine an optimal duration, or width, for radio frequency (RF) pulses (90° and 180° pulses, as examples) that are transmitted from the tool 40 for purposes of measuring the NMR properties of earth formations (such as a formation 32) that surround a borehole 41. In this manner, for a chosen operating RF frequency, there exists an optimal width for each RF pulse to ensure the correct flip angle and thus, the maximum signal-to-noise ratio (SNR) when measuring spin echo signals from a volume of investigation 42 within the formation 32.

Figure 3:
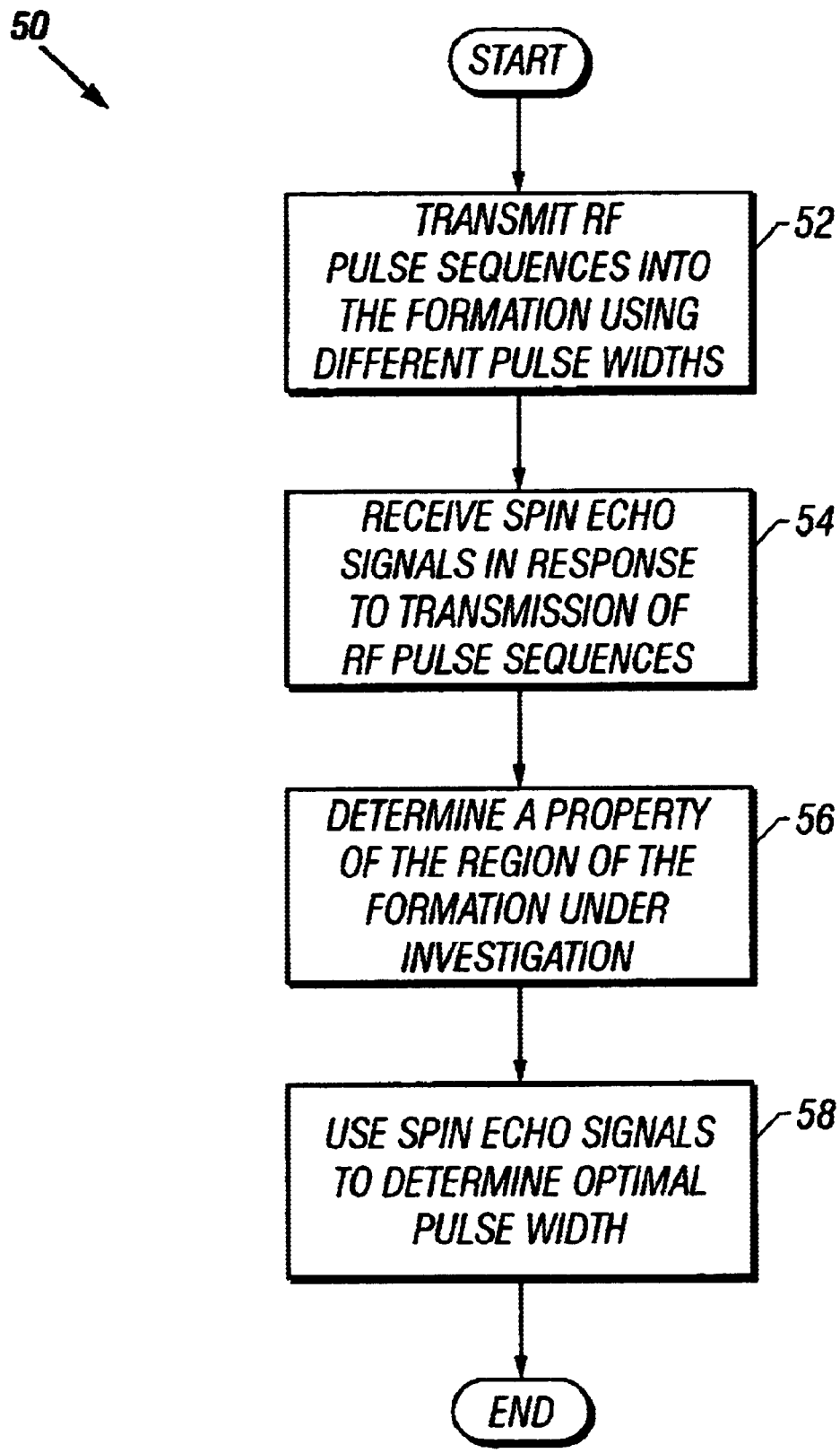
FIGS. 3 and 6 are flow diagrams depicting techniques to optimize RF pulse widths according to embodiments of the invention.

As described below, the NMR tool 40 may perform a technique 50 that is generally depicted in FIG. 3 to derive the optimal pulse width. In this manner, the tool 40 may transmit (block 52) RF pulse sequences into the formation and slightly vary (as described below) the pulse widths that are associated with these pulse sequences. The tool 40 receives (block 54) spin echo signals from the formation in response to the RF pulse sequences and uses the spin echo signals to determine (block 56) the properties of the formation in the volume of investigation 42. However, besides obtaining information from the received spin echo signals regarding the measured properties, the NMR tool 40 uses the spin echo signals to automatically find the optimal pulse width, as depicted in block 58. The technique 50 is generally referred to as a pulse width optimization (PWO) technique herein.

By finding the optimal pulse durations, not only may the NMR tool 40 optimize the SNR associated with its measurements, the NMR tool 40 may determine other valuable information, such as the specific location of the volume under investigation 42 and the detection of magnetic debris accumulation.

In some embodiments of the invention, the NMR tool 40 may use at least two different pulse widths (five, for example) for the pulses of the various RF pulse sequences. As described further below, this step may be repeated, and each data set that corresponds to each pulse width is stacked until the signal-to-noise ration (SNR) of the stacked data has reached a minimum threshold. A curve fitting technique may then be applied to these stacked data sets to determine the optimal pulse duration.

More particularly, in some embodiments of the invention, the NMR tool 40 may vary the pulse width to vary the predicted optimal flip angle $\alpha$ by a scaling factor that is in the set of [0.75 . . . 1.25] and use only a small number of different pulse widths, such as five, for example. For a signal-to-noise ratio (SNR) of 34 decibels (dB) (as an example), this means that the smallest spin echo signal (measured with 0.75 $\alpha$) that is received from the formation 32 is larger than 0.85 $\phi_{max}$, where the symbol "$\phi$" generally denotes an amplitude of the spin echo signal that is received from the formation 32, and the symbol "$\phi_{max}$" denotes the maximum possible value of the $\phi$ signal. Thus, given this example, the signal loss due to imperfect flip angles is less than 20%. For a higher SNR, the variation range of $\alpha$ and therefore, the average signal loss (called L) may even be smaller, since there exists a tradeoff between SNR and amplitude spread. Therefore, if the PWO measurements are performed at the same time to measure some meaningful property of the formation 32, the loss in accuracy of the NMR measurement due to the pulse width variations may be negligible.

Referring to FIG. 4, in some embodiments of the invention, the NMR tool 40 may transmit the RF pulse sequences as part of a measurement scan 108 to derive some property of the formation via a T2 distribution, for example. The scan 100 may include NMR RF pulse sequences 101 (RF pulse sequences 101₁, 101₂, 101₃ shown as examples) that are called "bursts." In this manner, a burst is an NMR pulse sequence that is associated with a short echo train (10 echoes, for example) and is possibly followed by a saturation sequence. Successive bursts are separated by a short wait time (40 milliseconds (ms), for example) that is depicted by the symbol "TW₂" in FIG. 4. Besides being used to perform the PWO measurements, the bursts are also used to measure meaningful formation properties. In this manner, the bursts may be used to, as examples, enhance short T2 information in T2 inversions or for T1-based BFV measurements (for partial polarization). For purposes of performing the PWO technique, the pulse width is varied for the various RF pulse sequences, and the measurements that are obtained for each pulse width are stored separately for later processing, as described below.

The measurement scan 108 may include NMR RF pulse sequences other than bursts. For example, the scan 108 may include pulse sequences, such as the pulse sequence 100, that are relatively long (more than one thousand pulses, for example) for purposes of acquiring longer T2 information, for example. These pulse sequences may be associated with longer wait times (one such wait time called $T_{w1}$ is depicted in FIG. 4). Therefore, the measurement scan 108 may use at least two different sequence lengths and/or wait times, the advantages of which can be appreciated by those skilled in the art. Depending on the particular embodiment, RF burst sequences, longer RF pulse sequences or a combination of these RF pulse sequences may be used by the PWO technique.

Referring to FIG. 5, in some embodiments of the invention, the above-described RF pulse sequences may be transmitted in a reoccurring pattern 100. In this manner, the pattern 110 may include p (where p is a positive integer) pulse sequences 107 (pulse sequences 107₁, 107₂, 107₃, 107ₖ and 107ₚ depicted as examples), each of which is associated with a different pulse width. For example, the pulse sequence 107₁, may be associated with pulses that each have a duration that is 0.75·$\alpha$, the pulse sequence 107₂ may be associated with pulses that each have a duration that is 1.25·$\alpha$, and so forth. As an example, each pulse sequence 107 may include two burst pulse sequences to form a phase alternating pair (PAP). Additionally, each burst sequence, in some embodiments of the invention, may include a CPMG (Carr-Purcell-Meiboom-Gill) pulse sequence.

The influence of possible variations of pulse amplitudes within the series of bursts due to power storage load (a voltage drop, for example) is suppressed by cycling repeatedly through the various flip angles, either cyclically (by sequentially cycling through a set [0.75, 0.85, 1, 1.15, 1.25] of scaling factors, for example) or in a balanced way (by sequentially cycling through a set [0.75, 1.25, 0.85, 1.15, 1] of scaling factors, for example). These variation patterns also suppress the influence of possibly increasingly incomplete saturation on the measurement, which might occur for short bursts and strong lateral motion.

Amplitudes determined from burst measurements with only a few echoes are relatively independent of motion. By interleaving the measurements for the different pulse widths in a short time interval and by stacking many of them, the remaining motion effects will have the same average influence on all of the stacked measurements. Therefore, motion may only reduce the SNR of the whole measurement by introducing a faster average decay, but will not distort the fit results.

Also, changes in the signal response of the formation over time should influence even the unstacked measurements identically since the collection of the measurements for the few (five, for example) bursts may be accomplished well before the NMR tool 40 has moved a substantial fraction of its antenna height.

In some embodiments of the invention, after the measurement scan 108, the burst measurements for each pulse width are summed and divided by 1-L (where "L" represents the signal loss for the scan, as described below) to scale them to the signal for the predicted optimal flip angle $\alpha$. The processing that follows may be same as for normal bursts. A phase correction is also applied to the data. For the phase correction, data from the other echo trains and previous data should be taken into account. Also at this point the data could be stacked as needed for the other downhole data analysis.

For PWO usage, the echo train amplitudes are determined using a signal-to-noise optimized linear estimator. This estimator may, for example, depend on the expected motion, the motion-sensitivity of the tool, and the T2 distribution that is expected for the present formation. For very few echoes (eight, for example) simply taking the sum should be adequate. By applying this PWO estimator to the above summed up bursts, the SNR for this particular measurement and estimator can be determined.

The accumulation of the PWO data may be controlled using this SNR. In this manner, for PWO analysis, the burst measurements that are associated with each pulse width are stacked separately. The goal is to ensure increasing the SNR of the stacked data with time. The optimal way of stacking can be done sequentially as following. If the standard deviation of the noise does not change substantially, the data can be weighted with the actual estimated SNR when stacking. On the other hand, if the standard deviation of the noise is changing, the data must be normalized by the noise, and then weighted with the expected SNR before the stacking process takes place. Also data with a SNR under a predefined threshold could be discarded. The threshold could be set to the SN-value under which, e.g., reliable phase correction is not possible anymore.

The accumulation (also called stacking) continues until the SNR of the stacked data is sufficient for the analysis, a predefined time interval has elapsed, or a predefined number of samples has been reached, as just a few examples. With the optimal way of stacking that is described above, it may be determined when the SNR of the stacked data will reach the minimum limit for fitting purposes. For example, it may be assumed that the fitting algorithm needs a SNR of 34 decibels (dB)=50, and it may be assumed that the minimal SNR for successful phase correction is 2. Thus, for this example, the minimal signal (i.e., a signal with a SNR of 2) has to be stacked 25*25=625 times to satisfy the SNR required for the analysis. A signal with 1.5 times the minimal SNR counts as 1.5*1.5 scans, a signal with 4 times the minimal SNR counts as 4*4 scans, etc. A signal with a scan count less than 4 is discarded. If this virtual number of scans has reached 625, the stacked data is handed over to the PWO fitting algorithm that then determines the optimal new pulse characteristic. This assumes that the noise level is the same for all scans. If the noise level varies the scans have to be scaled before stacking to the same noise level.

In some embodiments of the invention, the NMR tool 40 synchronizes the beginning and endings of the pulse with the Larmor frequency. For accurate fitting this deviation from the anticipated pulse width might have to be taken into account.

Table 1 below contains some exemplary estimations of needed accumulation time in dependence of bound fluid volume (BFV). The wait time is chosen to match a tapered BFV cutoff. For these estimations, the following parameters were chosen. It is assumed that nine echoes per burst were collected, and an estimate was made that summing the echoes together triples the SNR of the measurement. It is also assumed that of each of the 5 pulse durations, 4 phase alternating pairs (PAPs) are stacked within one 10 second scan. Furthermore, its is assumed that the tool has 6 pu noise per PAP echo. With these numbers a BFV of 2 pu would correspond to a SNR of about 2.

TABLE 1

| BFV/pu | SN reduction req. | nr. of scans | stacking time |
|---|---|---|---|
| 1 | 50 | 2500 | 6.94 h |
| 2 | 25 | 625 | 1.74 h |
| 4 | 12.5 | 156 | 26 min |
| 8 | 6.25 | 39 | 6.5 min |
| 16 | 3.125 | 10 | 1.63 min |
| 32 | 1.56 | 3 | 50 s |

In the above example, the wait time was chosen to be short to accommodate a possible fast logging speed. The analyzed number of echoes of each burst was limited to avoid the effect of severe motion. However, the analyzed number of echoes for each burst measurement and the prepolarization duration could be chosen with respect to the expected vertical speed as well as degree of severity of the transverse motion of the tool. Under better motion conditions, a longer wait time and a longer CPMG sequence could be used to acquire PWO data, and in the same time, be used to provide T2 based bound fluid (e.g., for a wait time of 0.2s and 200 echoes) or porosity and a T2 distribution (e.g., for a wait time greater than 1 second and a few hundred echoes).

Figure 6:
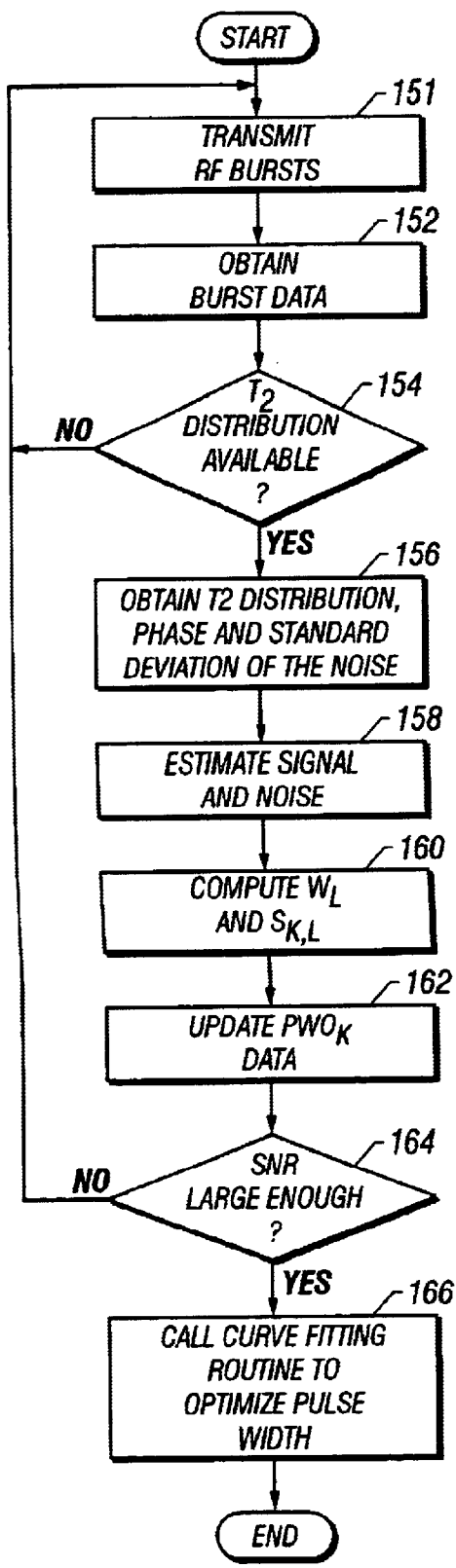

As a more specific example, in some embodiments of the invention, the NMR tool 40 may use a technique 150 that is depicted in FIG. 6 to both measure a property of the formation and optimize the pulse width for a particular flip angle. In this manner, the NMR tool 40 begins or continues a particular scan by transmitting (block 151) RF bursts 151 that result in the reception of spin echo signals from the formation. As an example, the RF bursts 151 may be a series of pulse sequences in which the pulse width is varied among the sequences, as described above. From these spin echo signals, the NMR tool 40 obtains (block 152) the burst data. In this manner, for a particular scan, the NMR tool 40 stacks corresponding spin echo components that are associated with the same pulse width together.

As an example, for a particular scan, the NMR tool 40 may transmit q (a positive integer) pulse sequences that are associated with the 0.075 scaled pulse width to obtain q spin echo signal trains. Each spin echo signal train, in turn, includes m (a positive number) spin echo signals. For stacking purposes, the NMR tool 40 may add the components of the corresponding spin echo signals together. For example, for all of the spin echo signals that were obtained using the 0.075 scaled pulse width pulse sequences, the NMR tool 40 may add the quadrature components of all of the second spin echo signals together, add the real components of all of the second spin echo signals together, add the quadrature components of all of the third spin echo signals together, add the real components of all of the third spin echo signals together, and so forth. The same technique that is described above for the 0.75 scaling factor is applied for the other p—1 scaling factors (where "p" indicates the number of scaling factors that are used) in the same scan.

At the point when the NMR tool 40 determines (diamond 154) that enough data has been collected to obtain a T2 distribution, a scan is completed. As an example, the NMR tool 40 may evaluate the SNR ratio of the stacked data to make this determination or may, as an example, determine enough data has been collected after a predetermined number of bursts. Alternatively, not only may the burst data be used to obtain a T2 distribution, additional scans that use longer wait times may be used as well to derive the T2 distribution. The NMR tool 40 needs the T2 distribution for purposes of estimating scaling factors for the PWO data, as described below. If the T2 distribution is not yet available, the NMR tool 40 transitions back to block 151 to begin performing another measurement cycle.

Otherwise, if the T2 distribution is available, then the measurement scan is complete. In response, the NMR tool 40 obtains the T2 distribution and other information that is available from the T2 inversion process, such as the phase and standard deviation of the noise, as depicted in block 156. Thus, from this information, the NMR tool 40 estimates (block 158) the signal and noise. For each pulse width, the NMR tool 40 may then compute (block 160) a sum (called $S_{k,l}$) of the associated stacked spin echo components for that scan. The "k" index in the $S_{k,l}$ sum expression indicates the particular pulse width, and the "1" index in the $S_{k,l}$ sum expression indicates the particular scan number. For example, in some embodiments of the invention, the $S_{k,l}$ sum may be computed according to the following equation:

$$S_{k,l} = \sum_{j=m_o}^{m} c_j \cdot (\cos\theta_1 R_{j,k,l} + \sin\theta_1 X_{j,k,l}), \forall k = 1, \ldots, p, \forall l,\quad \text{Equation 4}$$

where "$m_o$" is a positive integer that represents a starting echo number for the sum; "m" is a positive integer that indicates the number of echoes of each echo train, "θ" represents the phase of the echo signals; "R" represents the real component of a particular spin echo signal; X represents the quadrature component of a particular spin echo signal; and "k" is a positive integer that indicates a particular pulse width. The $c_j$ coefficients take into account the expected signal decay in the echo train and may be calculated according to the following equation:

$$c_j = \sum_{i=1}^{N_{T2}} A_i \cdot e^{\frac{-jte}{T_{2,i}}} \cdot \left(1 - e^{\frac{-tw}{\xi T_{2,i}}}\right),\quad \text{Equation 5}$$

where "$N_{T2}$", "$A_i$", "te", "$T_{2,i}$", "ξ" and "tw" are described below. Alternatively, in some embodiments of the invention, the $c_j$ coefficient may be replaced by a constant.

In order to prevent an eventual degradation in the quality of the stacked data due to a stronger ringing in the first few echoes, in some embodiments of the invention, the first few echo signals are ignored, as depicted by the $m_0$ index (that may not be a "1") indicating the first echo signal that is used for purposes of determining the $S_{k,l}$ sum.

In addition to computing the $S_{k,l}$ sum, the NMR tool 40 also computes (block 160) a weight (called $w_l$) to assign to the $S_{k,l}$ sum. In this manner, the $w_l$ weight takes into account an estimation of the particular noise that was experienced during the scan.

The NMR tool 40 next updates (block 162) the PWO data. In this manner, each pulse width has data, or a PWO indicator, represented by the symbol $PWO_k$, that is a weighted sum of all of the $S_{k,l}$ sums, as described by the following equation:

$$PWO_k = \sum_{\text{scan } l} w_l S_{k,l}, \forall k = 1, \ldots, p\quad \text{Equation 6}$$

If the NMR tool 40 determines (diamond 164) that the SNR has surpassed a predetermined threshold, then the NMR tool 40 calls (block 166) a routine (described below) that uses the $PWO_k$ data to optimize the pulse width, as described below. Otherwise, the NMR tool 40 transmits more RF bursts, as depicted in block 151.

Figure 8:
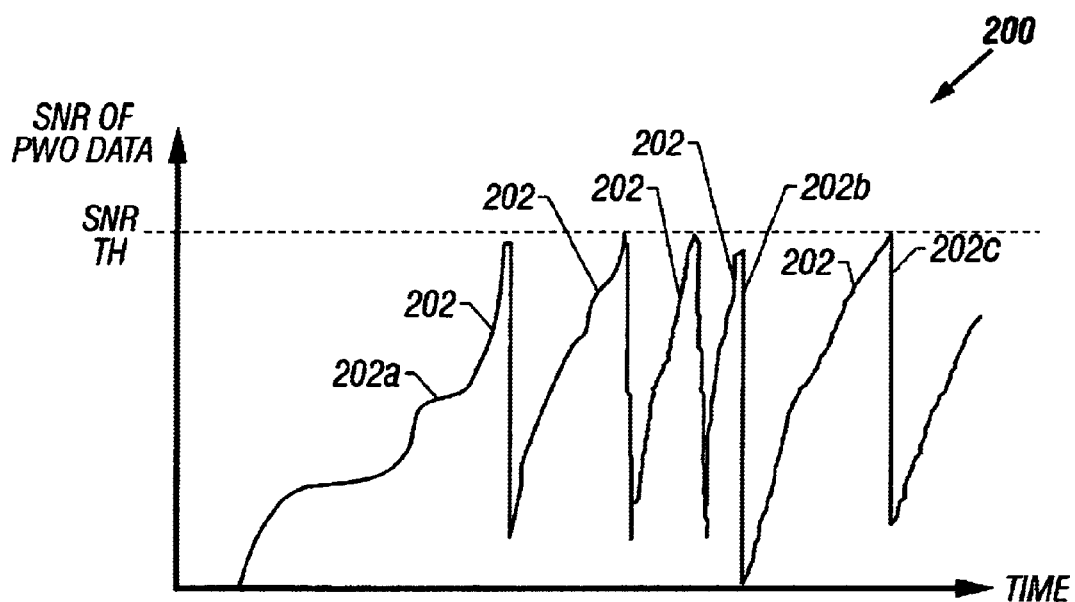
FIG. 8 is a graph of a signal-to-noise ratio of stacked data versus time according to an embodiment of the invention.

FIG. 8 depicts a SNR plot 200 of the stacked PWO data versus time. As shown, the SNR plot 200 may be subdivided into regions 202 (regions 202a, 202b and 202c, as examples) in which the SNR plot 200 ramps upward due to the stacking of the PWO data. For example, the region 202a rises over time until the SNR plot 200 reaches a predetermined threshold value (called $SNR_{TH}$). At this point, the PWO data is used to compute the optimal pulse width, so the PWO data (and SNR plot 200) returns to zero for purposes of stacking the PWO data again to calculate the optimal pulse width again. It is noted from FIG. 8 that the time interval in which the SNR plot 202 rises to the $SNR_{TH}$ threshold may vary depending on the properties of the surrounding formation and the magnetic debris accumulation, as examples. For example, the region 202b rises to the $SNR_{TH}$ threshold faster than the regions 202a and 202c.

Figure 7:
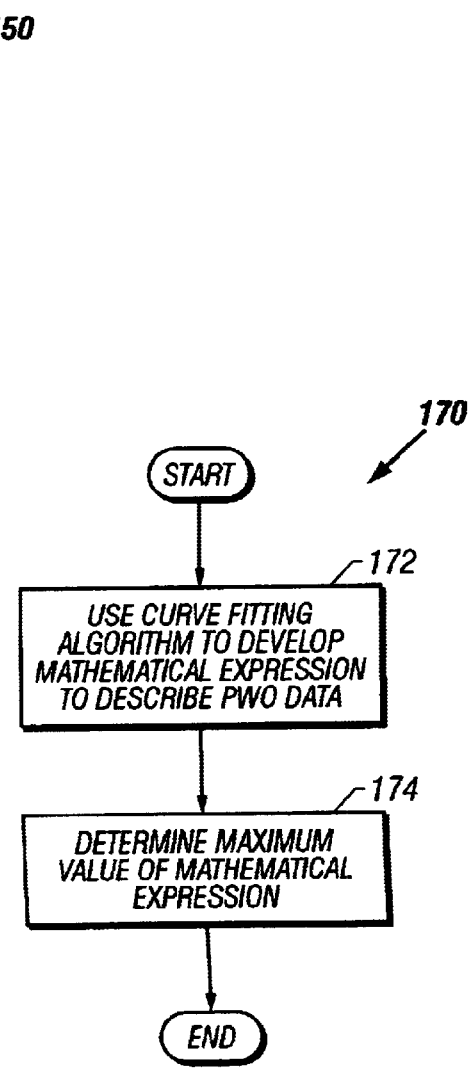
FIG. 7 is a flow diagram depicting a routine to determine an optimal pulse width from collected NMR data according to an embodiment of the invention.
Figure 9:
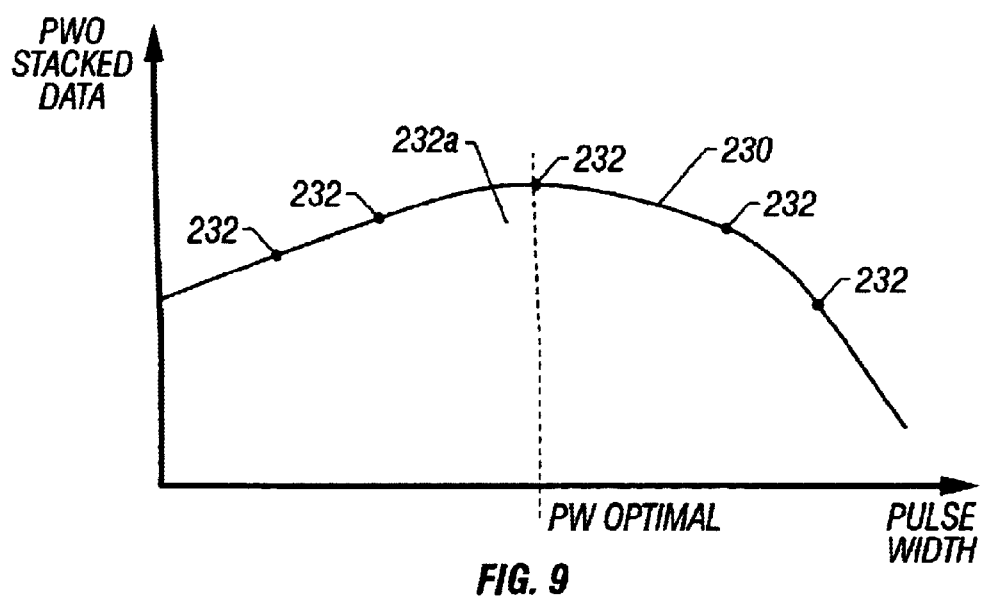
FIG. 9 is a graph of stacked NMR data fitted to a curve according to an embodiment of the invention.

In some embodiments of the invention, once the SNR ratio reaches the $SNR_{TH}$ threshold, the NMR tool 40 may perform a routine 170 (see FIG. 7) to determine the optimal pulse width. In this manner, the NMR tool 40 may use a curve-fitting algorithm to develop a mathematical expression to describe the PWO data, as depicted in block 172. In this manner, referring also to FIG. 9, each $PWO_k$ data point 232 (data point 232a depicted as an example) may be plotted and fitted to a curve 230, as shown in FIG. 9. As an example, the NMR tool 40 may use trigonometric functions to find the mathematical expression for the curve 40. Once the expression for the curve 40 is determined, the NMR tool 40 may determine (block 174 of FIG. 7) the maximum value of the mathematical expression. For the exemplary curve 230 that is depicted in FIG. 9, the maximum point is close to the data point 232a. Thus, the optimal pulse width is the pulse width (called $PW_{OPTIMAL}$ in FIG. 9) that produces this maximum point.

The NMR tool 40 may use the T2 distribution to determine the SNR in the following manner. The $T_2$ interval, [$T_{2,min}, T_{2,max}$], is discretized regularly in the logarithmic scale by $N_{T2}$ samples:

$$T_{2,i} = T_{2,min} \alpha^{i-1} \forall i = 1, \ldots, N_{T2},\quad \text{Equation 7}$$

with $$\alpha = \left(\frac{T_{2,max}}{T_{2,min}}\right)^{\frac{1}{N_{T2}-1}}\quad \text{Equation 8}$$

Assuming $A_i$ are the discrete amplitudes corresponding to $T_{2,i}$ of the $T_2$ distribution of the actual earth formation, it is assumed that the discrete $T_2$ distribution is normalized in such a way that $$\Phi := \sum_{i=1}^{N_{T2}} A_i$$

is the unitless porosity, i.e., equal to one for a 100 pu sample subjected to the measurement.

The $T_2$ distribution amplitudes $\{A_i\}$ may be obtained from the $T_2$ inversion procedure from the stacked spin echoes. In the description herein, the positive integer "n" denotes the total number of stackings of the echo trains that occur before the inversion takes place. Two important quantities that may be obtained from the $T_2$ inversion procedure are the standard deviation of the noise per stacked echo, σ, and the phase, θ, of the complex echo train. It is assumed that σ is expressed as unitless porosity, i.e., same unit than the porosity Φ.

The description above assumes rectangular RF pulses. However, in reality, the RF pulses may each have a non-rectangular shape due to the non-ideal RF antenna and transmitter. Therefore, the pulse shapes that are produced by the RF antenna and transmitter must be experimentally characterized with great care in order to implement correctly a mapping computation between the flip angle and the pulse width. One such mapping implementation may use the cubic-spline interpolation method and take only the quality factor Q of the RF antenna and echo filter characteristics as input parameters. Other antenna/transmitter compensation techniques may be used.

The optimal weight $w_j$, may be described by the following equation:

$$w_1 = \frac{\text{signal}}{\text{noise}^2}, \quad \text{Equation 9}$$

with $$\text{signal} = q \sum_{j=m_o}^{m} \sum_{i=1}^{N_{T2}} A_i \cdot c_j \cdot e^{\frac{-jte}{T_{2,i}}} \cdot \left(1 - e^{\frac{-tw}{\zeta T_{2,i}}}\right), \quad \text{Equation 10}$$

and $$\text{noise} = \sigma_1 \sqrt{nq \sum_{j=m_o}^{m} c_j^2}. \quad \text{Equation 11}$$

In these estimations, te and tw are respectively the echo spacing and the wait time using in the bursts; and $\zeta$ is the $T_1/T_2$ ratio used by the $T_2$ inversion process. The signal to noise of the stacked PWO data given in Equation 6 may be estimated as:

$$SNR = \left( \sum_{\text{scan\_1}} \left( \frac{\text{signal}}{\text{noise}} \right)^2 \right)^{\frac{1}{2}} \quad \text{Equation 12}$$

Figure 10:
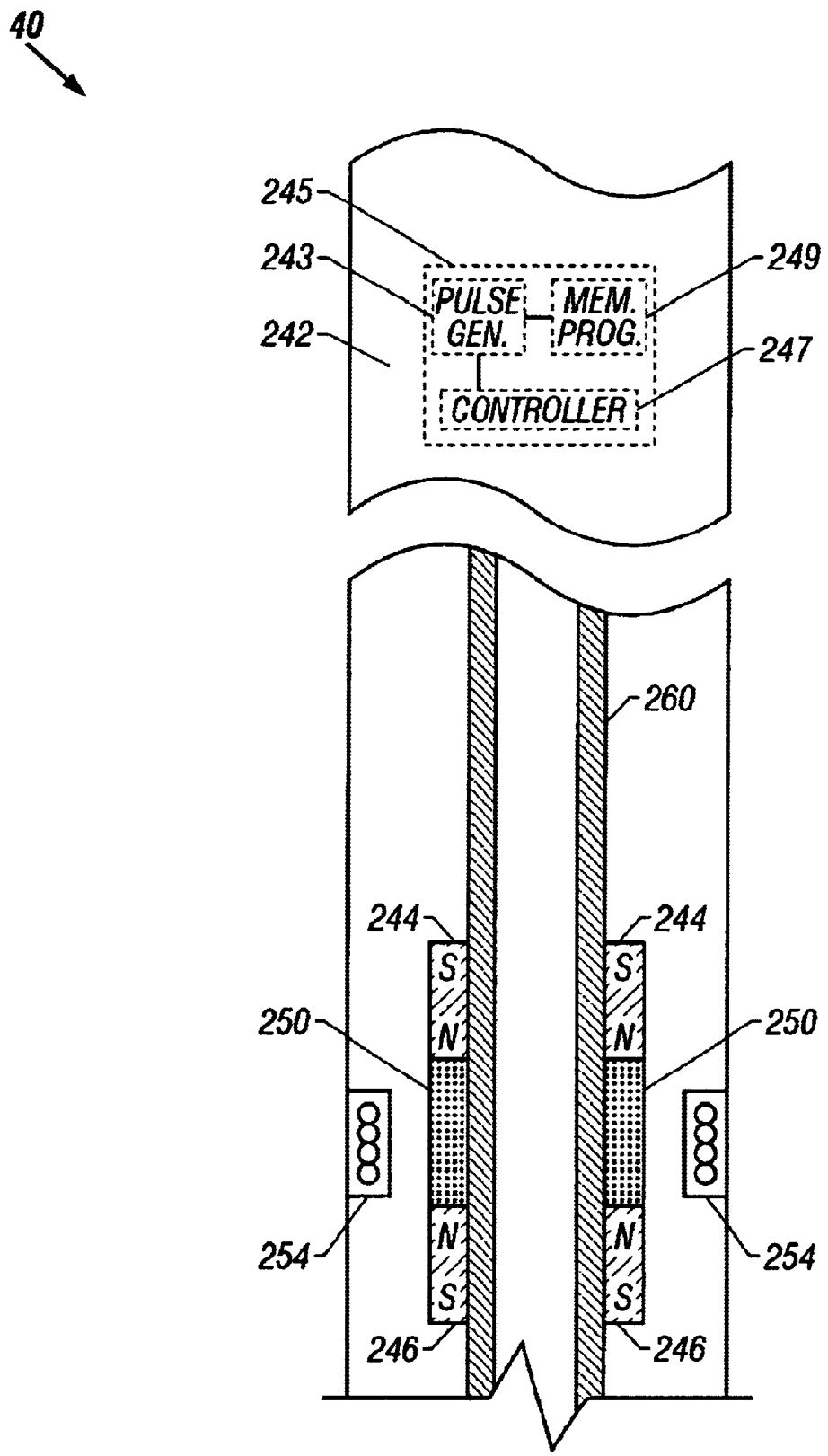
FIG. 10 is a schematic diagram of an NMR measurement tool according to an embodiment of the invention.

FIG. 10 depicts one out of many possible embodiments for the NMR tool 40. As depicted in FIG. 10, for this embodiment, the NMR tool 40 may include upper 244 and lower 246 permanent magnets that circumscribe an inner protective sleeve 260 of the NMR tool 40. The upper 244 and lower 246 magnets produce a radial, axisymmetric static $B_o$ field. The NMR tool 40 also includes an RF coil 254 to transmit $B_1$ pulses and receive spin echo signals. The RF coil 254 may be coupled to electronic circuitry 242 (of the NMR tool 40) that includes, among other things, a $B_1$ pulse generator 243 and a memory 245 to store indications of the received spin echoes before transmitting indications of the spin echos uphole. The electronics 242 may also include a controller 247 that is coupled to the pulse generator 243, the memory 245 and the RF coil 254. The memory 245 may also store instructions, or a program 249, that, when executed by the controller 247, cause the controller 247 to interact with the appropriate circuitry of the NMR tool 40 to perform the techniques 50 (FIG. 3), 150 (FIG. 6) and 170 (FIG. 7) to determine the optimal pulse width while measuring some property of the surrounding formation.

As an example, the north poles of the magnets 244 and 246 may face each other to furnish a $B_o$ field that has field lines that extend radially away from the longitudinal axis of the NMR tool 40. In some embodiments of the invention, for purposes of producing a more uniform $B_o$ field, the NMR tool 40 may include a magnetically permeable sleeve 250 that circumscribes the sleeve 260 and may be positioned between the upper 244 and lower 246 magnets. Of course other embodiments are possible for the NMR tool 40. As examples, the NMR tool 40 may be logging while drilling (LWD) tool or a wireline tool.

Other embodiments are within the scope of the following claims. For example, the above-described techniques describe a way to determine an optimal pulse width. However, an optimal pulse amplitude, another pulse characteristic, may be determined in a similar manner. More particularly, the NMR tool may transmit RF pulses that are associated with different pulse amplitudes rather than different pulse widths to determine the optimal pulse amplitude for producing a predetermined flip angle. The determination of the optimal pulse amplitude is performed in a manner that parallels the determination of the optimal pulse width that is described above. The optimal pulse width may used to, for example, calibrate parameters that are measured by the tool. For example, the optimal pulse width may be used to calibrate the amplitude of a porosity that is measured by the tool. The optimal pulse widths may be determined independently for the 90° and 180° pulses. In this manner, the optimal pulse width for the 180° pulse may not be exactly twice the optimal pulse width for the 90° pulse. Other arrangements are possible.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method usable with a downhole NMR measurement apparatus during a downhole logging operation to achieve an optimum signal to noise ratio that copenstates for variations in downhole conditions that affect pulse parameters comprising:

estimating a pulse width for producing a predetermined flip angle;

transmitting different RF pulse sequences into a downhole sample of an earth formation;

for each different RF pulse sequence, varying during a measurement cycle the estimated pulse width by a different scaling factor to produce flip angles near the predetermined flip angle;

receiving a set of spin echo signals in response to the transmission of each of the transmitted RF pulse sequences;

determining a property of the sample in response to at least a set of spin echo signals;

comparing sets of the spin echo signals received in response to the different RE pulse sequences to determine an optimal pulse width that is used for subsequently transmitted downhole RF pulse sequences, the optimal pulse width resulting in an optimum signal to noise ratio for directly received spin echo signals; and repeating for each of the subsequently transmitted RF pulse sequences the transmitting, receiving and comparing steps during the downhole logging operation to compensate for variations in downhole conditions that affect pulse parameters.

2. The method of claim 1, wherein the sample comprises a formation and the property comprises a petrophysical property.

3. The method of claim 2, wherein the property comprises a bound fluid volume.

4. The method of claim 1, wherein the using the spin echo signals comprises:

not using a spin echo signal that has amplitude less than a predetermined threshold.

5. The method of claim 1, wherein the varying the estimated pulse width comprises:

sequencing through a predefined set of scaling factors.

6. The method of claim 5, wherein the predefined set of scaling factors appear in an increasing order in the set.

7. The method of claim 5, wherein the predefined set of scaling factors do not appear in an increasing order in the set.

8. The method of claim 5, wherein the set comprises approximately five different scaling factors.

9. The method of claim 1, wherein each RF pulse sequence comprises approximately ten RF pulses.

10. The method of claim 1, wherein the RF pulse sequences comprise:
a first RF pulse sequence that is associated with a shorter wait time; and
a second RF pulse sequence that is associated with a longer wait time.

11. The method of claim 1, wherein
the transmitting different RF pulse sequences comprises transmitting different pluralities of RF pulse sequences, each plurality of RF pulse sequence using the same scaling factor, and
the using the spin echo signals comprises:
for each set of RF pulse sequences that are associated with the same scaling factor, stacking amplitudes of the spin echo signals that are associated with the set of RF pulse sequences to derive a stacked set of spin echo signals;
for each set of stacked spin echo signals, summing up at least some of the amplitudes of the stacked spin echo signals to derive a summation, each summation being associated with a different one of the scaling factors; and
using the summations to determine the optimal pulse width.

12. The method of claim 11, wherein the summing up at least some of the amplitudes of the stacked spin echo signals to a derive a summation comprises:
for each set of stacked spin echo signals, weighting the amplitudes of the stacked spin echo signals to reflect a decay of the amplitudes to produce associated weighted amplitudes; and
for each set of stacked spin echo signals, adding the associated weighted amplitudes together.

13. The method of claim 11, wherein the summations are associated with a measurement scan, the method further comprising:
computing other summations derived from other measurement scans, different summations being associated with different ones of the scaling factors; and
combining summations that are associated with the same scaling factor to form a pulse width indicator,
wherein using the summations comprise using the pulse width indicators to determine the optimal pulse width.

14. The method of claim 11, wherein the using the summations comprises:
applying a curve fitting algorithm to the pulse width indicators to derive a mathematical expression that describes the pulse width indicators; and
determining a maximum value of the mathematical expression to determine the optimal pulse width.

15. The method of claim 11, wherein the combining summations comprises:
assigning a weight to each summation to form a weighted summation; and
adding the weighted summations together.

16. The method of claim 15, wherein the assigning the weight comprises:
determining a signal-to-noise ratio associated with the scan associated with the summation; and
basing the assignment of the weight on the determined signal-to-noise ratio.

17. The method of claim 16, wherein the determination of the signal-to-noise ratio comprises:
performing an additional NMR measurement of the sample;
without summing results of the measurement with other NMR measurements, determining the signal-to-noise ratio from said additional NMR measurement.

18. The method of claim 11, further comprising:
determining a number of summations that have been combined; and
determining the optimal pulse width only after the number surpasses a predetermined threshold.

19. The method of claim 11, further comprising:
determining a signal-to-noise ratio of the combined summations;
continuing to combine the summations until the signal-to-noise ratio reaches a threshold; and
determining the optimal pulse width only after the signal-to-noise ratio reaches the threshold.

20. The method of claim 1, further comprising:
using the optimal pulse duration to determine depth of investigation.

21. The method of claim 1, further comprising:
using the optimal pulse duration to determine an amount of magnetic debris downhole.

22. The method of claim 1, further comprising:
using the optimal pulse duration to calibrate an amplitude of a porosity measurement by the measurement apparatus.

23. An NNR measurement apparatus for achieving during a downhole logging operation an optimum signal to noise ratio that compensates for variations in downhole conditions that affect pulse parameters comprising:
at least one magnet to establish a static magnetic field,
at least one antenna;
an RF pulse transmitter coupled to said at least one antenna; and
a controller coupled to the transmitter and said at least one antenna and adapted to:
cause the RF transmitter to transmit RF pulse sequences into a downhole sample and for each different RF pulse sequence, vary during a measurement cycle an estimated pulse width for producing a predetermined flip angle by a different scaling factor to produce flip angels near the predetermined flip angle;
receive a set of spin echo signals in response to the transmission of each of the transmitted RF pulse sequences;
determine a property of the sample in response to at least a set of spin echo signals;
compare sets of the spin echo signals received in response to the different RF pulse sequences to determine an optimal pulse width that is used for subsequently transmitted downhole RF pulse sequences, the optimal pulse width resulting in an optimum signal to noise ratio for directly received spin echo signals; and
repeating for each of the subsequently transmitted RF pulse sequences the transmitting, receiving and comparing steps during the downhole logging operation to compensate for variations in downhole conditions that affect pulse parameters.

24. The NMR measurement apparatus of claim 23, wherein the property comprises a petrophysical property.

25. The NMR measurement apparatus of claim 23, wherein the controller is adapted to not use an amplitude of a spin echo signal in determining the optimal pulse width if the amplitude is less than a predetermined threshold.

26. The NMR measurement apparatus of claim 23, wherein the controller varies the estimated pulse width by sequencing through a predefined set of scaling factors.

27. The NMR measurement apparatus of claim 26, wherein the scaling factors appear in an increasing order in the predefined set of scaling factors.

28. The NMR measurement apparatus of claim 26, wherein the scaling factors do not appear in an increasing order in the predefined set of scaling factors.

29. The NMR measurement apparatus of claim 26, wherein the set comprises approximately five different scaling factors.

30. The NMR measurement apparatus of claim 23, wherein each RF pulse sequence comprises approximately ten RF pulses.

31. The NMR measurement apparatus of claim 23, wherein the RF pulse sequences comprise:
    a first RF pulse sequence that is associated with a shorter wait time; and
    a second RF pulse sequence that is associated with a longer wait time.

32. The NMR measurement apparatus of claim 23, wherein
    the controller transmits different pluralities of RF pulse sequences, each plurality of RF pulse sequence using the same scaling factor, and
    the controller is adapted to use spin echo signals by:
        for each set of RF pulse sequences that are associated with the same scaling factor, stacking amplitudes of the spin echo signals that are associated with the set of RF pulse sequences to derive a stacked set of spin echo signals;
        for each set of stacked spin echo signals, summing up at least some of the amplitudes of the stacked spin echo signals to derive a summation, each summation being associated with a different one of the scaling factors; and
        using the summations to determine the optimal pulse width.

33. The NMR measurement apparatus of claim 32, wherein controller derives the summations by:
    for each set of stacked spin echo signals, weighting the amplitudes of the stacked spin echo signals to reflect a decay of the amplitudes to produce associated weighted amplitudes; and
    for each set of stacked spin echo signals, adding the associated weighted amplitudes together.

34. The NMR measurement apparatus of claim 32, wherein the summations are associated with a measurement scan, wherein the controller is further adapted to:
    compute other summations derived from other measurement scans, different summations being associated with different ones of the predefined scaling factors; and
    combine summations that are associated with the same predefined scaling factor to form a pulse width indicator,
    wherein the controller is adapted to use the pulse width indicators to determine the optimal pulse width.

35. The NMR measurement apparatus of claim 34, wherein the controller is adapted to use the pulse indicators by:
    applying a curve fitting algorithm to the pulse width indicators to derive a mathematical expression that describes the pulse width indicators; and
    determining a maximum value of the mathematical expression to determine the optimal pulse width.

36. The NMR measurement apparatus of claim 34, wherein the controller is adapted to combine the summations by:
    assigning a weight to each summation to form a weighted summation; and
    adding the weighted summations together.

37. The NMR measurement apparatus of claim 36, wherein the controller is adapted to assign the weight by:
    determining a signal-to-noise ratio associated with the scan associated with the summation; and
    basing the assignment of the weight on the determined signal-to-noise ratio.

38. The NMR measurement apparatus of claim 34, wherein the controller is further adapted to:
    determine a number of summations that have been combined; and
    determine the optimal pulse width only after the number surpasses a predetermined threshold.

39. The NMR measurement apparatus of claim 34, wherein the controller is further adapted to:
    determine a signal-to-noise ratio of the combined summations;
    continue to combine the summations until the signal-to-noise ratio reaches a threshold; and
    determine the optimal pulse width only after the signal-to-noise ratio reaches the threshold.

40. The NMR measurement apparatus of claim 23, wherein the apparatus comprises a downhole tool and the sample comprises a region of a downhole formation.

41. A method for achieving during a downhole NMR logging operation an optimum signal to noise ratio that compensates for variations in downhole conditions that affect pulse parameters comprising:
    estimating a pulse characteristic needed to produce a predetermined nip angle;
    transmitting different RF pulse sequences into a downhole sample;
    for each different RF pulse sequence, varying during a measurement cycle the estimated characteristic by a different scaling factor to produce flip angles near the predetermined flip angle;
    receiving a set of spin echo signals in response to the transmission of each of the transmitted RF pulse sequences;
    determining a property of the sample in response to at least a set of spin echo signals;
    comparing sets of the spin echo signals received in response to the different RF pulse sequences to determine an optimal value that is used for a subsequently transmitted downhole RF pulse sequence, the optimal value resulting in an optimum signal to noise ratio for directly received spin echo signals; and
    repeating the subsequently transmitted RF pulse sequence the transmitting, receiving and comparing steps during the downhole logging operation to compensate for variations in downhole conditions that affect pulse parameters.

42. The method of claim 41, wherein the predetermined pulse characteristic comprises a pulse amplitude.

43. The method of claim 41, wherein the predetermined pulse characteristic comprises a pulse width.

44. The method of claim 41, wherein the RF pulse sequences comprise:
- a first RF pulse sequence that is associated with a shorter wait time; and
- a second RF pulse sequence that is associated with a longer wait time.

45. The method of claim 41, wherein
the transmitting different RF pulse sequences comprises transmitting different pluralities of RF pulse sequences, each plurality of RF pulse sequence using the same scaling factor, and
the using the spin echo signals comprises:
- for each set of RF pulse sequences that are associated with the same scaling factor, stacking amplitudes of the spin echo signals that are associated with the set of RF pulse sequences to derive a stacked set of spin echo signals;
- for each set of stacked spin echo signals, summing up at least some of the amplitudes of the stacked spin echo signals to derive a summation, each summation being associated with a different one of the scaling factors; and
- using the summations to determine the optimal pulse width.

46. The method of claim 45, wherein the summing up at least some of the amplitudes of the stacked spin echo signals to a derive a summation comprises:
- for each set of stacked spin echo signals, weighting the amplitudes of the stacked spin echo signals to reflect a decay of the amplitudes to produce associated weighted amplitudes; and
- for each set of stacked spin echo signals, adding the associated Weighted amplitudes together.

47. The method of claim 45, wherein the summations are associated with a measurement scan, the method further comprising:
- computing other summations derived from other measurement scans, different summations being associated with different ones of the scaling factors; and
- combining summations that are associated with the same scaling factor to form a pulse characteristic indicator,
- wherein using the summations comprise using the pulse characteristic indicators to determine the optimal value.

48. The method of claim 45, wherein the using the summations comprises:
- applying a curve fitting algorithm to the pulse width indicators to derive a mathematical expression that describes the pulse characteristic indicators; and
- determining a maximum value of the mathematical expression to determine the optimal value.

49. The method of claim 45, wherein the combining summations comprises:
- assigning a weight to each summation to form a weighted summation; and
- adding the weighted summations together.

50. The method of claim 49, wherein the assigning the weight comprises:
- determining a signal-to-noise ratio associated with the scan associated with the summation; and
- basing the assignment of the weight on the determined signal-to-noise ratio.

51. The method of claim 45, further comprising:
- determining a number of summations that have been combined; and
- determining the optimal value only after the number surpasses a predetermined threshold.

52. The method of claim 45, further comprising:
- determining a signal-to-noise ratio of the combined summations;
- continuing to combine the summations until the signal-to-noise ratio reaches a threshold; and
- determining the optimal value only after the signal-to-noise ratio reaches the threshold.

53. A method usable with an NMR measurement apparatus for achieving during a downhole logging operation an optimum signal to noise ratio, that compensates for variations that affect pulse parameters comprising:
- estimating a first pulse width for producing a ninety degree flip angle;
- estimating a second pulse width for producing a one hundred eighty degree flip angle;
- transmitting a first set of different RF pulse sequences into a downhole sample;
- for each different RF pulse sequence of the first set, varying the estimated first pulse width by a different first scaling factor to produce first flip angles near the ninety degree Dip angle;
- transmitting a second set of different RE pulse sequences into the downhole sample;
- for each different RF pulse sequence of the second set, varying the estimated second pulse width by a different second scaling factor to produce second flip angles near the one hundred eighty degree flip angle;
- receiving first and second spin echo signals in response to the transmission of the first and second set of RF pulse sequences;
- determining a property of the sample in response to the first and second spin echo signals;
- comparing the first and second spin echo signals to independently determine a first optimal pulse width that is used for another subsequently transmitted downhole RF pulse sequence for producing the ninety degree flip angle and a second optimal pulse width that is used for a subsequently transmitted downhole RF pulse sequence for producing the one hundred eighty degree flip angle, the first optical pulse width resulting in an optimum signal to noise ratio for a first plurality of directly received spin echo signals and the second optimal pulse width resulting in an optimum signal to noise ration for a second plurality of directly received spin echo signals; and
- repeating for each of the subsequently transmitted RE pulse sequences the transmitting, receiving and comparing steps during the downhole logging operation to compensate for variations in downhole conditions that affect pulse parameters.

54. The method of claim 53, wherein the sample comprises a formation and the property comprises a petrophysical property.

55. The method of claim 54, wherein the property comprises a bound fluid volume.

* * * * *